US008971544B2

(12) United States Patent
Gauger, Jr. et al.

(10) Patent No.: US 8,971,544 B2
(45) Date of Patent: Mar. 3, 2015

(54) SIGNAL COMPRESSION BASED ON TRANSDUCER DISPLACEMENT

(75) Inventors: Daniel M Gauger, Jr., Berlin, MA (US); Paul Yamkovoy, Berlin, MA (US); Ricardo F. Carreras, Southborough, MA (US)

(73) Assignee: Bose Corporation, Framingham, MA (US)

( * ) Notice: Subject to any disclaimer, the term of this patent is extended or adjusted under 35 U.S.C. 154(b) by 410 days.

(21) Appl. No.: 13/335,178

(22) Filed: Dec. 22, 2011

(65) Prior Publication Data

US 2013/0163767 A1 Jun. 27, 2013

(51) Int. Cl.
*H03G 11/00* (2006.01)

(52) U.S. Cl.
USPC ................ 381/55; 381/71.1; 381/74; 381/79; 381/92; 381/56; 704/E21.014

(58) Field of Classification Search
CPC .......... H04R 3/007; H04R 3/00; H04R 3/002; H04R 29/001; H04R 29/003; H03F 1/52; H03F 2200/331; H03F 1/30; H03F 2200/03; H03G 11/00; H03G 11/008; H03G 11/02; H03G 11/04
USPC ........ 381/55, 164, 317, 318, 71.1, 71.2, 71.8, 381/71.11, 71.12, 71.13, 71.14, 73.1, 74, 381/79, 92, 93, 94.1, 94.2, 94.3, 94.7, 95, 381/122, 56, 58, 59; 704/E21.014; 700/94
See application file for complete search history.

(56) References Cited

U.S. PATENT DOCUMENTS

| | | | | |
|---|---|---|---|---|
| 5,181,252 | A * | 1/1993 | Sapiejewski et al. | 381/372 |
| 6,683,965 | B1 | 1/2004 | Sapiejewski | |
| 2003/0048911 | A1 | 3/2003 | Furst et al. | |
| 2005/0031139 | A1 * | 2/2005 | Browning et al. | 381/96 |
| 2009/0141906 | A1 | 6/2009 | Truesdell | |
| 2011/0228945 | A1 * | 9/2011 | Mihelich et al. | 381/59 |

OTHER PUBLICATIONS

U.S. Appl. No. 12/969,685, filed Jan. 9, 2011.
U.S. Appl. No. 13/075,889, filed Mar. 30, 2011.
International Search Report and Written Opinion of the International Searching Authority dated Feb. 27, 2013 for PCT/US2012/066005.

* cited by examiner

*Primary Examiner* — Leshui Zhang
(74) *Attorney, Agent, or Firm* — Brian M. Dingman; Dingman, McInnes + McLane, LLP

(57) ABSTRACT

A method for adjusting the performance of an electroacoustic transducer includes receiving, by gain adjustment circuit, a displacement signal corresponding to a relative motion between a magnetic structure of the electroacoustic transducer and a voice coil of the electroacoustic transducer. The method includes detecting, by the gain adjustment circuit, a displacement signal value of the displacement signal as one of meeting or exceeding a displacement signal threshold. The method includes modifying, by the gain adjustment circuit, a loop gain of an active noise reduction loop associated with the electroacoustic transducer when the displacement signal value of the displacement signal one of meets or exceeds the displacement signal threshold.

17 Claims, 4 Drawing Sheets

SIGNAL COMPRESSION BASED ON TRANSDUCER DISPLACEMENT

FIELD

This disclosure relates to adjusting the performance of an electroacoustic transducer in response to detecting relative motion among components of the transducer.

BACKGROUND

Conventional active noise reduction (ANR) headsets utilize acoustic output generated by the headsets' electroacoustic transducers to minimize the user's perception of ambient noise. For example, a conventional ANR headset has a noise cancelling assembly associated with each electroacoustic transducer. The noise cancelling assembly can include a microphone mounted in proximity to the electroacoustic transducer within each of the headset's ear cups. During operation, the microphones receive an audio input as heard by the user and associated electronics filter the resulting audio signal, based on the principle of feedback control, to generate a noise cancelling signal. The noise cancelling assembly feeds the noise-cancelling signal to the electroacoustic transducer amplifier, which, in turn, combines the noise-cancelling signal with desired audio from an audio source, if one is present. The noise-cancelling signal creates destructive interference with ambient noise, such as noise generated external to the headset, as the ambient noise and the combined audio signal arrive at a user's ear. The noise cancelling assembly thus minimizes the ambient noise perceived by the user and allows the user to experience a substantially clear audio input from the audio source.

In use, when placed over the user's ears, the ear cups associated with the headset form a seal between the user's head and a volume containing each of the electroacoustic transducers. The air captured between the user's ears and each electroacoustic transducer acts as a spring having a relatively high spring constant such that the air reduces displacement or excursion of each electroacoustic transducer during operation (i.e., as compared to the effect of the air captured between the user's ears and the electroacoustic transducer if the ear cup were not sealed to the head). However, in certain cases, one or both of the ear cups may not be completely sealed against the user's head. In such a case, because the volume within the ear cup is exposed to external, atmospheric air pressure, the air captured between the user's ear and the electroacoustic transducer acts as a spring having a relatively low spring constant. In certain cases an associated ANR headset amplifier is designed to provide high amplitude signals to the electroacoustic transducer in order to cancel high levels of noise under normal wearing conditions, such as when the ear cups form a relatively tight seal to the user's head. During conditions where the seal is not as tight (e.g., is leaky) the resulting decreased spring constant of the air captured between the user's ear and the electroacoustic transducer can allow the transducer to be over-extended even with a normal voltage drive signal level.

To minimize clipping or distortion when using a relatively large voltage drive signal, conventional ANR headsets utilize a compressor to reduce ANR loop gain when the drive signal voltage crosses a threshold that approaches the amplifier clipping limit. Typically, for conventional ANR headsets utilized in relatively high-noise environments, the voltage threshold is based upon the maximum drive signal voltage that the electroacoustic transducer or driver can safely tolerate at low frequencies in free air or unloaded conditions. This is done to protect the electroacoustic transducer or driver from potentially damaging levels of displacement. By reducing ANR loop gain when clipping is approached, the driver is protected and clipping, and the unpleasant audio artifacts therefore, can also be prevented. Accordingly, by reducing the loop gain to the electroacoustic transducer amplifier based upon the drive signal voltage the headset minimizes both clipping of the audio signal output and potential damage to the electroacoustic transducer components as caused by over actuation.

SUMMARY

Conventional reduction of ANR loop gain compression based upon a drive signal voltage can over-constrain the drive signal to the electroacoustic transducer in typical use cases. For example, the reduction in loop gain is based on the drive signal voltage that corresponds to a maximum safe free-air displacement of the electroacoustic transducer, independent of frequency. However, in the case where the ear cup is not completely sealed against the user's head, even though the air captured between the electroacoustic transducer and the user's head has a relatively low spring constant, the air does generate a load on the electroacoustic transducer to decrease the relative displacement of the electroacoustic transducer components. Accordingly, while the compressor in a conventional ANR headset reduces the gain provided by the ANR headset amplifier to the electroacoustic transducer, such reduction is substantially below the relative displacement limits of the components of the transducer at any given degree of partial seal of the ear cup to the head, which reduces the amount of sound pressure that can be generated.

By contrast to conventional approaches, embodiments of the present innovation relate to signal compression based upon electroacoustic transducer displacement. In an ANR headset, such as a high-noise headset, a compressor or gain adjustment component is configured to adjust ANR loop gain, such as via feedback compression, based upon components of an electroacoustic transducer approaching their fundamental displacement limits. With such a configuration, when the headset is worn normally by a user (i.e., well sealed to the user's head), the electroacoustic transducer amplifier can provide an increased amount of power to the electroacoustic transducer during operation, thereby allowing the electroacoustic transducer to generate relatively higher sound pressure levels in the ANR headset, such as sound pressure levels of about 20 dB greater than the levels provided by conventional headsets, before reaching a maximum displacement limit. Additionally, because operation of the signal compression circuitry is dependent upon the displacement of the electroacoustic transducer, the circuitry can adapt its operation based upon any seal condition present between the user's head and the headset. For example, if the headset is leaky or removed from the user's head such that the electroacoustic transducer is effectively unloaded by the relatively low spring constant that results from such conditions, the transducer's displacement will increase, relative to a normally loaded transducer, for a given voltage. Accordingly, the displacement-sensing compressor will trigger at driver voltages akin to the limits in conventional voltage-limiting compressors.

In general, one aspect of the disclosure features an acoustic assembly, having an electroacoustic transducer, a microphone transducer disposed in proximity to the electroacoustic transducer, and a gain adjustment circuit disposed in electrical communication with at least one of the magnetic structure and the voice coil. The gain adjustment circuit is configured to receive a displacement signal corresponding to a relative motion between a magnetic structure of the electroacoustic transducer and a voice coil of the electroacoustic transducer, detect a displacement signal value of the displacement signal as one of meeting or exceeding a displacement signal threshold and modify a loop gain of an active noise reduction loop associated with the electroacoustic transducer when the displacement signal value of the displacement signal one of meets or exceeds the displacement signal threshold.

Various additional implementations may include one or more of the following features. The acoustic assembly may include a threshold detector, configured to detect, as a displacement signal value, an absolute value of the displacement signal. The gain adjustment circuit can also include a current limited source and an integrator component. In response to detecting the absolute value of the displacement signal value of the displacement signal as one of meeting or exceeding a displacement signal threshold the threshold detector is configured to activate the current limited source to generate a current. Additionally, the current limited source is configured to provide the current to the integrator component of the gain adjustment circuit and the integrator component is configured to provide a compressor control signal to a compressor component of the gain adjustment circuit based upon the output of the integrator component.

In one implementation, when modifying the loop gain of the active noise reduction loop associated with the electroacoustic transducer the compressor component of the gain adjustment circuit can be configured to modify the loop gain of the active noise reduction loop associated with the electroacoustic transducer based upon the received compressor control signal. Also, when receiving the displacement signal, the gain adjustment circuit can be configured to receive a displacement signal associated with a change in capacitance within the electroacoustic transducer as created by relative motion between the magnetic structure of the electroacoustic transducer and the voice coil of the electroacoustic transducer.

In one implementation, the gain adjustment circuit can be further configured to receive a driving signal associated with the electroacoustic transducer, the driving signal configured to generate relative motion between the magnetic structure of the electroacoustic transducer and the voice coil of the electroacoustic transducer and detect an absolute value of a driving signal value of the driving signal as one of meeting or exceeding a driving signal threshold. When modifying the loop gain of the active noise reduction loop associated with the electroacoustic transducer, the gain adjustment is operable to modify the loop gain of the active noise reduction loop associated with the electroacoustic transducer when at least one of the displacement signal one of meets or exceeds the displacement signal threshold and the absolute value of driving signal value one of meets or exceeds the driving signal threshold. When detecting the displacement signal value of the displacement signal as one of meeting or exceeding a displacement signal threshold, the threshold detector can be configured to detect, as the displacement signal value, an absolute value of the displacement signal. When detecting the absolute value of the driving signal value of the driving signal as one of meeting or exceeding a driving signal threshold, the threshold detector can be configured to detect the absolute value of the driving signal value as one of meeting or exceeding a driving signal threshold.

In one implementation, when modifying the loop gain of the active noise reduction loop associated with the electroacoustic transducer, the gain adjustment circuit is configured to reduce the loop gain of the active noise reduction loop associated with the electroacoustic transducer when the displacement signal value of the displacement signal one of meets or exceeds the displacement signal threshold.

In general another aspect of the disclosure features a method for adjusting the performance of an electroacoustic transducer. The method includes receiving, by gain adjustment circuit, a displacement signal corresponding to a relative motion between a magnetic structure of the electroacoustic transducer and a voice coil of the electroacoustic transducer. The method includes detecting, by the gain adjustment circuit, a displacement signal value of the displacement signal as one of meeting or exceeding a displacement signal threshold. The method includes modifying, by the gain adjustment circuit, a loop gain of an active noise reduction loop associated with the electroacoustic transducer when the displacement signal value of the displacement signal one of meets or exceeds the displacement signal threshold.

In general another aspect of the disclosure features an acoustic assembly, having an active noise reduction assembly having electroacoustic transducer, a microphone transducer disposed in proximity to the electroacoustic transducer, and an amplifier stage disposed in electrical communication with the microphone and the electroacoustic transducer, the active noise reduction assembly defining an active noise reduction loop having a loop gain. The acoustic assembly includes a displacement sensing circuit disposed in electrical communication with at least one of a magnetic structure of the electroacoustic transducer and a voice coil of the electroacoustic transducer. The acoustic assembly also includes a gain adjustment circuit disposed in electrical communication with the active noise reduction loop of the active noise reduction assembly and in electrical communication with the displacement sensing circuit and being operable to modify the loop gain of the active noise reduction loop when a displacement signal value of a displacement signal generated by the displacement sensing circuit one of meets or exceeds a displacement signal threshold.

BRIEF DESCRIPTION OF THE FIGURES

The foregoing and other objects, features and advantages will be apparent from the following description of particular embodiments of the innovation, as illustrated in the accompanying drawings in which like reference characters refer to the same parts throughout the different views. The drawings are not necessarily to scale, emphasis instead being placed upon illustrating the principles of various embodiments of the innovation.

DETAILED DESCRIPTION

Embodiments of the present innovation relate to signal compression based upon electroacoustic transducer displacement. In an ANR headset, such as a high-noise headset, a compressor or gain adjustment component is configured to adjust ANR loop gain with an electroacoustic transducer, such as via feedback compression, based upon components of the electroacoustic transducer approaching their fundamental displacement limits. With such a configuration, when the headset is worn normally by a user (i.e., well sealed to the user's head), the electroacoustic transducer amplifier can provide an increased amount of power to the electroacoustic transducer during operation, thereby allowing the electroacoustic transducer to generate relatively higher sound pressure levels in the ANR headset, such as sound pressure levels of about 20 dB greater than the levels provided by conventional headsets, before reaching a maximum displacement limit. Additionally, because operation of the signal compression circuitry is dependent upon the displacement of the electroacoustic transducer, the circuitry can adapt its operation based upon any seal condition present between the user's head and the headset. For example, if the headset is leaky or removed from the user's head such that the electroacoustic transducer is effectively unloaded by the relatively low spring constant that results from such conditions, the transducer's displacement will increase, relative to a normally loaded transducer, for a given voltage. Accordingly, the displacement-sensing compressor will trigger at driver voltages akin to the limits in conventional voltage-limiting compressors.

Figure 1:
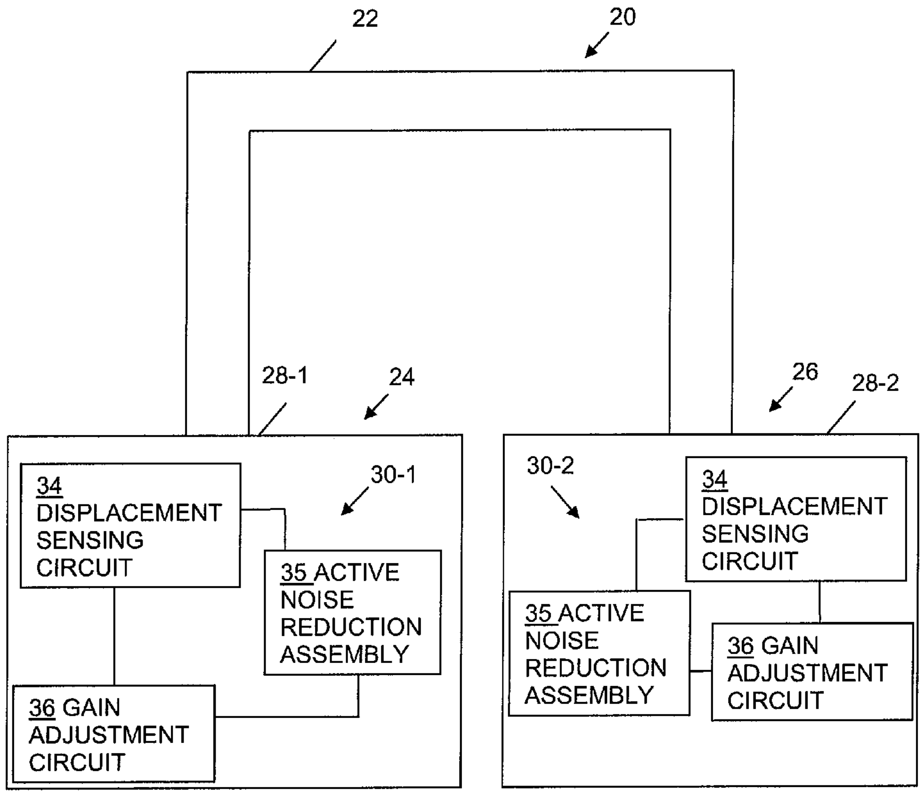
FIG. 1 is a schematic representation of a partial sectional view of a headset, according to one arrangement.

FIG. 1 is an example schematic representation of a headset 20, such as an on-ear active noise reduction (ANR) headset. As illustrated, the headset 20 includes a support apparatus 22 that carries a first housing assembly 24 and a second housing assembly 26 at opposing ends of the apparatus 22. In the example headset 20 shown, while the support apparatus 22 is illustrated as a head strap the support apparatus 22 can be configured in a variety of ways. For example, the support apparatus 22 can be configured as a nape band or under-helmet support. In one arrangement, each of the first and second housing assemblies 24, 26 are configured to be held against a user's head via the head support apparatus 22 to form respective seals with the user's head about each of the user's ears. During operation, each of the first and second housing assemblies 22, 24 is configured to deliver noise-reduced audio to the user based upon known noise cancellation techniques.

As illustrated, each of the first and second housing assemblies 24, 26 includes a corresponding housing 28-1, 28-2 that carries an acoustic assembly 30-1, 30-2 that includes an active noise reduction assembly 35, a displacement sensing circuit 34, and a gain adjustment circuit 36. In one arrangement, the configuration of the components of the acoustic assembly 30-1 is substantially similar to the acoustic assembly 30-2 of the second housing assembly 26. For convenience, a description of the components of the first housing assembly 24 is provided below.

As illustrated, the displacement sensing circuit 34 is disposed in electrical communication with both the active noise reduction assembly 35 and the gain adjustment circuit 36 while the gain adjustment circuit 36 is disposed in electrical communication with the displacement sensing circuit 34 and with the active noise reduction assembly 35. In use, and as will be described in detail below, the gain adjustment circuit 36 is configured to adjust a loop gain associated with the active noise reduction assembly 35 based upon the relative displacement of components of an electroacoustic transducer of the active noise reduction assembly 35, as detected by the displacement sensing circuit 34.

Figure 2:
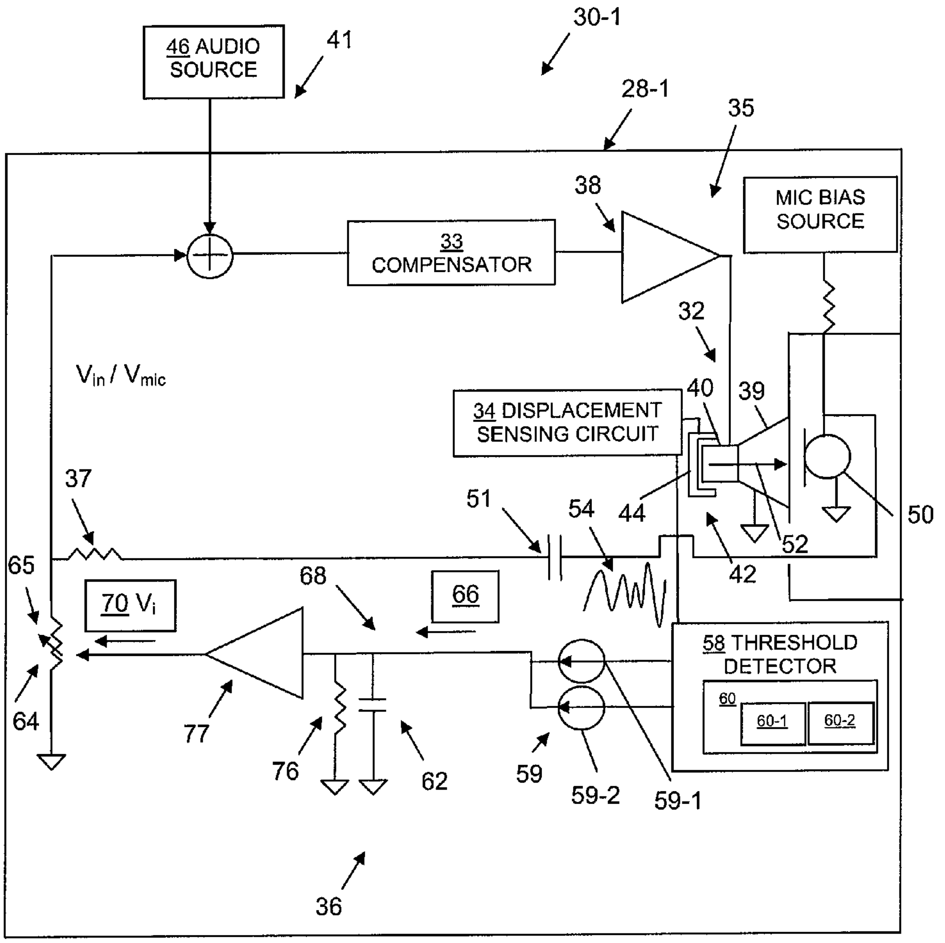
FIG. 2 is a schematic representation of a gain adjustment circuit of the headset of FIG. 1, according to one arrangement.

With reference to FIG. 2, the active noise reduction (ANR) assembly 35 includes an electroacoustic transducer 32, a microphone transducer 50 and circuitry (not shown), a compensator 33, and an amplifier stage 38 arranged to form an ANR loop. For example, the microphone transducer 50 is disposed in proximity to (i.e., in front of) the electroacoustic transducer 32 and is disposed in electrical communication with the compensator 33 via DC blocking capacitor 51, and resistors 37 and 64. The compensator 33, in turn, is disposed in electrical communication with the amplifier stage 38 which is disposed in electrical communication with the electroacoustic transducer 32.

As shown, the electroacoustic transducer 32 includes a diaphragm 39 secured to the housing 28-1 by a basket 44 and connected to a voice coil 40 which may be self-supporting or may be wound around a coil-former or bobbin (not shown). The electroacoustic transducer 32 also includes a magnetic assembly 42 disposed in electromagnetic communication with the voice coil 40. In some examples, the voice coil 40 and at least part of the magnetic assembly 42 are reversed, such that the magnetic assembly 42 moves the diaphragm 39 and the voice coil 40 remains stationary relative to the basket 44.

During operation, the microphone transducer 50 receives an audio input as heard by a user. The microphone transducer circuitry filters the corresponding audio signal generated by the microphone transducer 50, based on the principle of feedback control, to generate a noise cancelling signal and feeds the noise-cancelling signal through resistors 37 and 65 and then to the amplifier stage 38 through the compensator 33. The amplifier stage 38, in turn, can combine the noise-cancelling signal with a desired audio signal from the audio source 46 and feeds the combined audio signal to the electroacoustic transducer 32.

As a result of the amplifier stage 38 providing the combined audio signal to the electroacoustic transducer 32, the voice coil 40 interacts with a magnetic field of the magnetic assembly 42 to produce forces that move the voice coil 40 and diaphragm 39 relative to the magnetic assembly 42 and basket 44 to acoustically radiate the combined audio signal, as audio input, to a user's ear. Accordingly, as ambient noise and the combined audio signal arrive at a user's ear the noise-cancelling portion of the combined audio signal creates destructive interference with the ambient noise to minimize the user's perceived presence of ambient noise and allow the user to experience a substantially clear audio from the audio source 46.

The displacement sensing circuit 34 is configured to detect the relative displacement of components of the electroacoustic transducer 32. While the displacement sensing circuit 34 can be configured in a variety of ways, in one arrangement, the displacement sensing circuit 34 measures the displacement based upon a change in the capacitance between certain components of the electroacoustic transducer 32 and converts the capacitance into a signal representative of the displacement.

With respect to the capacitance associated with electroacoustic transducer 32, in one arrangement, a capacitance exists between the voice coil 40 and the side walls of the magnetic assembly 42. As the voice coil 40 moves in and out of the magnetic assembly 42 along direction 52, the overlap of the surface area between the voice coil 40 and the side walls of the magnetic assembly 42, and the resulting capacitance between them, varies. Accordingly, the capacitance between the voice coil 40 and the magnetic assembly 42 is proportional to the relative positioning between the voice coil 40 and the magnetic assembly 42. In response to receiving a varying signal affected by a change in capacitance between the voice coil 40 and the magnetic assembly 42, the displacement sensing circuit 34 generates a corresponding displacement signal 54. Additional description of the capacitive coupling of the voice coil 40 and the magnetic assembly 42 is provided in U.S. patent application Ser. No. 13/075,899, filed Mar. 30, 2011, and entitled "Measuring Transducer Displacement," the contents and teachings of which are hereby incorporated by reference in their entirety.

In another arrangement, the diaphragm 39 of the electroacoustic transducer 32 is coated with a layer of metal. Additionally a corresponding metalized limiter (not shown) is disposed in proximity to the diaphragm 39. The layer of metal on the limiter forms a back plate and the layer of metal on the diaphragm 39 forms a front plate of a two plate capacitor. The capacitance between the front and back plates is proportional to the relative positioning between the voice coil 40 and the magnetic assembly 42. For example, in operation, a voltage source with a series resistor, the value of which is selected to maintain a substantially constant charge across the plates, imposes a constant charge condition. As the diaphragm 39 moves relative to the metalized limiter, a capacitance between the plates changes in proportion to the relative change in distance between the diaphragm 39 and the limiter. The change in capacitance changes the corresponding voltage across the plates. In response to receiving the changed voltage signal, the displacement sensing circuit 34 generates a corresponding displacement signal 54. Additional description of the capacitive coupling of the diaphragm 39 and the limiter is provided in U.S. patent application Ser. No. 12/969,685, filed Jan. 9, 2011, and entitled "Transducer with Integrated Sensor," the contents and teachings of which are hereby incorporated by reference in their entirety.

The displacement sensing circuit 34 utilizes a change in the capacitance between components of the electroacoustic transducer 32 to detect the relative displacement of components of the electroacoustic transducer 32. With such a configuration, the headset 20 does not require the integration of separate displacement sensing elements, such as an optical encoder or laser interferometer.

The gain adjustment circuit 36 is configured to receive a displacement signal 54 from the displacement sensing circuit 34 and adjust the loop gain associated with the ANR assembly 35 based upon the displacement signal 54. While the gain adjustment circuit 36 can be configured in a variety of ways, in the example configuration illustrated in FIG. 2, the gain adjustment circuit 36 includes a threshold detector 58, a current limited sources 59, an integrator component 62, and a compressor component 64.

The threshold detector 58, such as a diode, transistor, or full wave precision rectifier circuit combined with a comparator, is configured to detect both the positive and negative portions of the displacement signal 54 and compare the positive and negative portions to a displacement signal threshold 60. For example, during operation, as the threshold detector 58 receives the displacement signal 54, the threshold detector 58 takes the absolute value of the displacement signal voltages or values that constitute the displacement signal 54 and compares the resulting displacement signal value to the displacement signal threshold 60. This threshold 60, in one arrangement, is a voltage level corresponding to a voltage associated with the displacement signal 54 when the voice coil 40 and the magnetic structure 42 experience a relative displacement that can cause clipping of a resulting audio signal or damage to the electroacoustic transducer 32. For example, assume the case where the relative excursion of voice coil 40 and the magnetic structure 42 of a distance of 1.0 mm will begin to cause clipping of a resulting audio signal and will cause the displacement sensing circuit 34 to include a corresponding displacement signal value of 4V as part of the displacement signal 54. In such a case, a manufacturer can configure the threshold detector 58 with a displacement signal threshold 60 of slightly below 4V, to minimize the occurrence of clipping.

In the case where the displacement signal value meets or exceeds the threshold 60, the threshold detector 58 enters an operational state and activates the current limited source to provide the current 66 to the integrator component 62.

The integrator component 62 is configured to receive the current 66 from the current limited source 59 and convert the current 66 to a voltage or compressor control signal 70, $V_i$, that is proportional to the accumulation of current 66. For example, as illustrated the integrator component 62 is configured as a capacitor. With such a configuration, as soon as the integrator component 62 receives the current 66 from the current limited source 59, the integrator component 62 increases the compressor control signal 70 ($V_i$) with a relatively rapid attack rate. Over time, as a displacement signal value of the displacement signal 54 falls below the threshold 60, the voltage on integrator component 62 decays through resistor 76 with a relatively slow release rate back towards a steady state, such as that occurring at low level or quiet conditions thus returning the compressor control signal 70 to its steady state value. In one arrangement, a discharge resistor 76 combined with the value of the integrating capacitor 62 sets the time constant for the discharge rate. Accordingly, the discharge resistor 76, as selected by a manufacturer or designer, is utilized in conjunction with the integrator component 62 to drain the charge from the integrator component 62 at a relatively slow rate.

In response to the change in the current 66, the integrator component 62 provides the proportional output 70 ($V_i$) to the compressor component 64 via a buffer 77. The compressor component 64 is configured to adjust the loop gain associated with the ANR assembly 35 in response to receiving the integrator component output 70 ($V_i$). While the compressor component 64 and buffer 77 can be configured a variety of ways, in one arrangement, the compressor component 64 and buffer 77 are configured as a field effect transistor (FET) that operates as a buffer and variable resistor. In use, as will be described in detail below, based upon the integrator component output 70 ($V_i$), the compressor component 64 attenuates the loop gain feedback signal to minimize clipping of the audio signal produced by the electroacoustic transducer 32 and to minimize potential damage to the components of the electroacoustic transducer 32 caused by relative over-excursion of the components.

Figure 3:
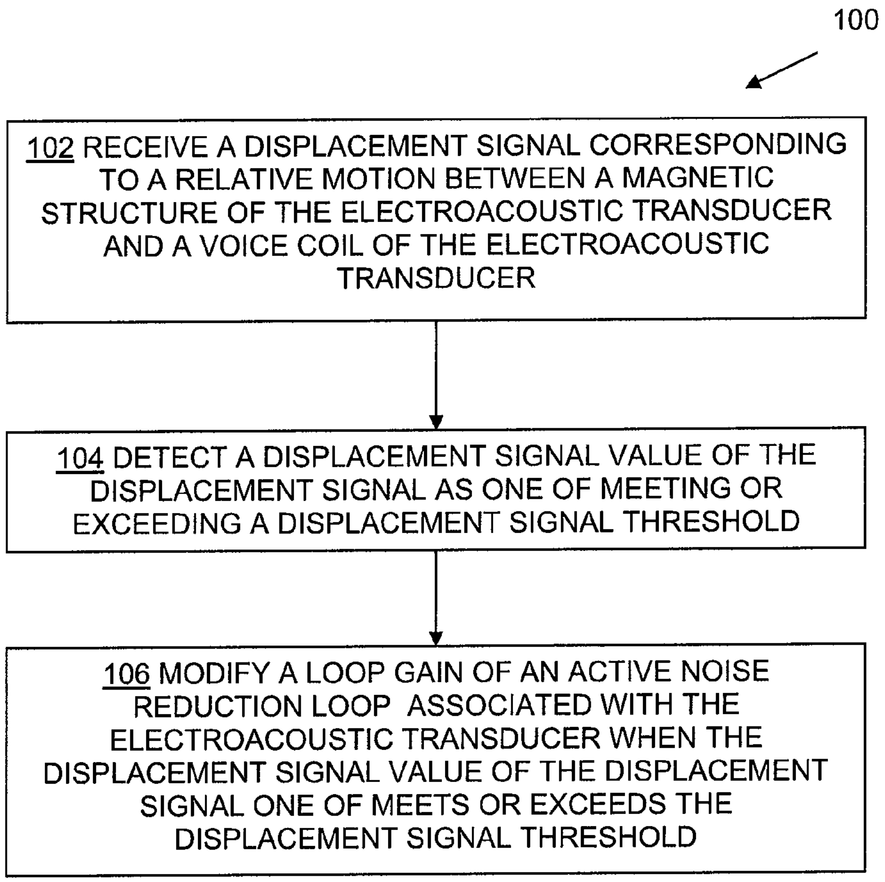
FIG. 3 is a flowchart illustrating a method for adjusting the performance of an electroacoustic transducer.

FIG. 3 is a flowchart 100 illustrating a method performed by the gain adjustment circuit 36 for adjusting the performance of the electroacoustic transducer 32.

In step 102, the gain adjustment circuit 36 receives a displacement signal 54 corresponding to a relative motion between a magnetic structure 42 of the electroacoustic transducer 32 and a voice coil 40 of the electroacoustic transducer 32. As indicated above, and with reference to FIG. 2, during operation the displacement sensing circuit 34 detects a change in capacitance between the electroacoustic transducer 32 components that is proportional to the relative displacement of the voice coil 40 and the magnetic structure 42. In response, the displacement sensing circuit 34, generates a corresponding displacement signal 54 having a voltage that is proportional to the capacitance and, therefore, the relative positioning between the voice coil 40 and the magnetic structure 42. The displacement sensing circuit 34 provides the displacement signal 54 to the threshold detector 58 in a substantially continuous manner.

Returning to FIG. 3, in step 104, the gain adjustment circuit 36 detects a displacement signal value of the displacement signal 54 as one of meeting or exceeding a displacement signal threshold 60. For example, with reference to FIG. 2, assume the case where the displacement signal threshold 60 is set to a value of 4V. As the threshold detector 58 receives the displacement signal 54 during operation, the threshold detector 58 takes the absolute value of the displacement signal 54 and compares the absolute value of the displacement signal 54 to the displacement signal threshold 60. In the case where the displacement signal 54 includes a displacement signal voltage value of +/−4V, the threshold detector 58 detects the displacement signal value as meeting the threshold 60 and activates a current limited source 59 to generate a current 66. The current limited source 59 provides the current 66 to the integrator 62 which, in turn, provides a corresponding compressor control signal ($V_i$) 70, having a voltage proportional to the accumulation of current 66, to the compressor component 64.

Returning to FIG. 3, in step 106, the gain adjustment circuit 36 modifies a loop gain of an active noise reduction loop 35 associated with the electroacoustic transducer 32 when the displacement signal value of the displacement signal 54 one of meets or exceeds the displacement signal threshold 60. For example, with reference to FIG. 2, the compressor component 64 initiates feedback compression with respect to the loop gain of the ANR assembly 35 based upon the compressor control signal 70 received from the integrator 62. In one arrangement, the voltage $V_{in}$ of the ANR assembly 35 is based upon the relationship: $V_{in}=(R_{comp}/(R_{comp}+R_i))*V_{mic}$ where $R_{comp}$ is the resistance of the compressor component 64, $R_i$ is the resistance of the resistor 37 and $V_{mic}$ is the voltage associated with the microphone transducer 50. As the compressor component 64 receives the compressor control signal $V_i$ 70 from the integrator 62, the compressor component 64 reduces its resistance $R_{comp}$ to a value inversely proportional to the compressor control signal 70. Accordingly, based upon the above relationship, as $R_{comp}$ decreases, $V_{in}$ also decreases where the reduction of $V_{in}$ relates to a reduction in the loop gain of the ANR assembly 35. It should be noted that in the case where the value of the compressor control signal $V_i$ 70 decreases over time, as caused by the relatively slow release rate of the integrator 62, the compressor component 64 increases its resistance $R_{comp}$ to increase the loop gain of the ANR assembly 35 at the correspondingly slow rate.

For a headset 20, such as a high-noise headset, feedback compression or gain reduction based upon the relative displacement of the electroacoustic transducer 32 components limits the audio signal provided to the electroacoustic transducer 32 to minimize transducer excursion clipping and potential damage to the electroacoustic transducer 32 components. Accordingly, when the headset 20 is worn by a user, the gain adjustment circuit 36 allows the electroacoustic transducer 32 to receive an increased amount of power, compared to conventional headsets. With such an increase in the amount of power, the headset 20 can generate higher cancelling pressures, such as an increase by about 20 dB before the electroacoustic transducer reaches the displacement limit for the voice coil 40 and the magnetic assembly 42. Additionally, when the headset 20 is removed from the user's head, a front portion of the electroacoustic transducer 32 becomes unloaded and a relative displacement between the voice coil 40 and the magnetic assembly 42 can increase for a given audio source signal voltage. In such a case, the gain adjustment circuit 36 can be activated to reduce electroacoustic transducer driver voltages, such as at the voltage levels found in conventional voltage-limiting headsets.

While various embodiments of the innovation have been particularly shown and described, it will be understood by those skilled in the art that various changes in form and details may be made therein without departing from the spirit and scope of the innovation as defined by the appended claims.

Figure 4:
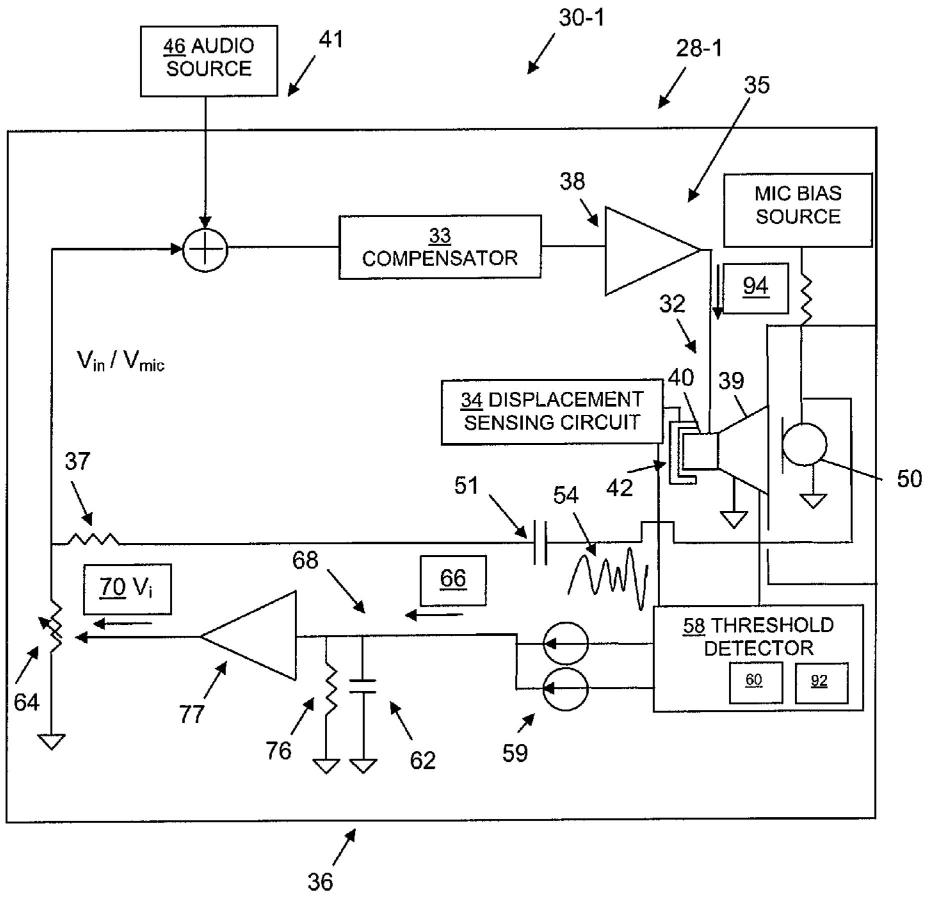
FIG. 4 is a schematic representation of an adjustment circuit of the electroacoustic transducer assembly of FIG. 1, according to an alternate arrangement.

For example, the gain adjustment circuit 36 can work in conjunction with other components to adjust the gain of the amplifier stage 38. With reference to FIG. 4, the gain adjustment circuit 36 can be configured to operate based upon receipt of a driving signal 94 from the electroacoustic transducer 32, in addition to receipt of the displacement signal 54. As illustrated, the threshold detector 58 is configured with a driving signal threshold 92 that corresponds to an absolute value of voltage of an audio or driving signal associated with a clipping limit of the amplifier stage 38. During operation, the threshold detector 58 receives the driving signal 94 from the electroacoustic transducer 32 and receives the displacement signal 54 from the displacement sensing circuit 34. When the threshold detector 58 detects either an absolute value of a driving signal value associated with the driving signal 94 as meeting or exceeding the driving signal threshold 92 or the displacement signal value, such as the absolute value of the displacement signal value 90 of the displacement signal 54 as meeting or exceeding the displacement signal threshold 58, the threshold detector 58 causes the compressor component 64 to reduce a loop gain of the ANR assembly 35, such as described above.

Utilization of both the driving signal 94 and the displacement signal 54 provides the ANR assembly 35 with a level of operational flexibility. For example, operation of threshold detector 58 based upon the driving signal 94 can be appropriate to protect the electroacoustic transducer 32 from a thermal perspective or if amplifier clipping is impending.

Furthermore, as indicated above, the gain adjustment circuit 36 includes a threshold detector 58, an integrator component 62, and a compressor component 64. It should be noted that each component 58, 62, 64 of the gain adjustment circuit 36 can be configured as individual analog components or as a single discrete analog component. Additionally, the gain adjustment circuit 36 can be configured as a computerized device having a controller, such as a processor and a memory, or a digital signal processor operable to perform the functions of the gain adjustment circuit 36 as described herein. When configured as a computerized device or a digital signal processor, the integrator component 62 and compressor component 64 can be configured as a counter operable to adjust ANR loop gain. In use, when the threshold detector 58 detects the absolute value of the displacement signal 54 as exceeding the threshold 60, then the counter is decremented at a relatively fast rate (e.g., relatively large steps in value) to rapidly reduce ANR loop gain. When the absolute value of the displacement signal 54 subsequently falls below the threshold 60, the counter is then incremented at a relatively slow rate (e.g., relatively small steps in value) to slowly restore ANR loop gain.

In another example, and as indicated above, FIG. 1 is a schematic representation of an over ear or on-ear headset 20. Such representation is by way of example only. In one arrangement, the headset is configured as an in-ear headset where a user places at least a portion of the housings 24, 26 within his ear and the friction between the housings 24, 26 and the user's ears maintain the headset 20 on the user's head. Alternately, the headset can be configured as a circum-aural or as a supra-aural headset.

In another example, the gain adjustment circuit 36 is described as modifying the loop gain of the ANR loop between the microphone transducer 50 and the compensator 33. Such description is by way of example only. The gain adjustment circuit 36 is operable to modify the loop gain anywhere in the ANR loop signal path from the microphone transducer 50 to the amplifier stage 38.

As indicated above, the threshold detector 58 is configured to detect both the positive and negative portions of the displacement signal 54 and compare the positive and negative portions to a displacement signal threshold 60. During operation, as the threshold detector 58 receives the displacement signal 54, the threshold detector 58 takes the absolute value of the displacement signal voltages or values that constitute the displacement signal 54 and compares the resulting displacement signal value to the displacement signal threshold 60. As described, in the case where the absolute value of the displacement signal value meets or exceeds the threshold 60, the threshold detector 58 enters an operational state and activates the current limiting source 59 to provide the current 66 to the integrator component 62. Such description is by way of example only. In one arrangement, the displacement signal threshold 60 includes a first displacement signal threshold 60-1, corresponding to a positive threshold, and a second displacement signal threshold 60-2, corresponding to a negative threshold, and the current limited source 59 is configured as a first current limited source 59-1 and a second current limited source 59-2.

In use, when the threshold detector 58 detects the displacement signal 54 as being above the first displacement signal threshold 60-1, the threshold detector 58 activates the first current limited source 59-1 to deliver a positive current 66 to the integrator component 62. Additionally, when the threshold detector 58 detects the displacement signal 54 as being below the second displacement signal threshold 60-2, the threshold detector 58 activates the second current limited source 59-2 to deliver a positive current 66 to the integrator component 62. In such an arrangement, the threshold detector 58 is configured to activate a current limited source, either the first or second current limited source 59-1, 59-2, to cause the compressor component to adjust ANR loop gain in response to either the positive and negative portions of the displacement signal 54 meeting or crossing the respective thresholds 60-1, 60-2.

As described above, the threshold detector 58 is configured to detect both the positive and negative portions of the displacement signal 54 and compare the positive and negative portions to a displacement signal threshold 60. Such description is by way of example only. In one arrangement, the threshold detector 58 is configured to detect either the positive or negative portions of the displacement signal 54 and compare the respective positive and negative portions to a displacement signal threshold 60.

We claim:

1. A method for adjusting a performance of an electroacoustic transducer, comprising:

(a) receiving, by a gain adjustment circuit, a displacement signal associated with a change in capacitance within the electroacoustic transducer as created by a relative motion between a magnetic structure of the electroacoustic transducer and a voice coil of the electroacoustic transducer;

(b) receiving, by the gain adjustment circuit, a driving signal associated with the electroacoustic transducer, the driving signal configured to generate relative motion between the magnetic structure of the electroacoustic transducer and the voice coil of the electroacoustic transducer;

(c) detecting, by the gain adjustment circuit, a displacement signal value of the displacement signal as meeting or exceeding a displacement signal threshold;

(d) detecting, by the gain adjustment circuit, an absolute value of a driving signal value of the driving signal as meeting or exceeding a driving signal threshold;

(e) modifying, by an output current of a current limited source circuit of the gain adjustment circuit, a loop gain of an active noise reduction loop associated with the electroacoustic transducer;

(f) wherein modifying, by the output current of the current limited source circuit of the gain adjustment circuit, the loop gain of the active noise reduction loop associated with the electroacoustic transducer, comprises:

(i) activating the current limited source circuit to provide the output current at a first value that is used to modify the loop gain when the absolute value of the driving signal value meets or exceeds the driving signal threshold;

(ii) activating a first current limited source of the current limited source circuit to provide the output current at a second value that is used to modify the loop gain when the displacement signal is above a first displacement signal threshold; and (iii) activating a second current limited source of the current limited source circuit to provide the output current at a third value that is used to modify the loop gain when the displacement signal is below a second displacement signal threshold.

2. The method of claim 1, wherein:

detecting the displacement signal value of the displacement signal as meeting or exceeding the displacement signal threshold comprises detecting, by a threshold detector of the gain adjustment circuit, an absolute value of the displacement signal.

3. The method of claim 1, further comprising providing the output current of the current limited source circuit to an integrator component of the gain adjustment circuit; and providing, by the integrator component of the gain adjustment circuit, a compressor control signal to a compressor component of the gain adjustment circuit based upon an output of the integrator component.

4. The method of claim 3, wherein modifying the loop gain of the active noise reduction loop associated with the electroacoustic transducer comprises modifying, by the compressor component of the gain adjustment circuit, the loop gain of the active noise reduction loop associated with the electroacoustic transducer based upon the received compressor control signal.

5. The method of claim 1, wherein:

detecting the displacement signal value of the displacement signal as meeting or exceeding the displacement signal threshold comprises detecting, by a threshold detector of the gain adjustment circuit and as the displacement signal value, an absolute value of the displacement signal; and detecting the absolute value of the driving signal value of the driving signal as meeting or exceeding the driving signal threshold comprises detecting, by the threshold detector of the gain adjustment circuit, the absolute value of the driving signal value of the driving signal as meeting or exceeding the driving signal threshold.

6. The method of claim 1, wherein modifying the loop gain of the active noise reduction loop associated with the electroacoustic transducer comprises reducing, by the gain adjustment circuit, the loop gain of the active noise reduction loop associated with the electroacoustic transducer when the displacement signal value of the displacement signal meets or exceeds the displacement signal threshold.

7. An acoustic assembly, comprising:

(a) an electroacoustic transducer with a magnetic structure and a voice coil;

(b) a microphone transducer disposed in proximity to the electroacoustic transducer; and (c) a gain adjustment circuit disposed in electrical communication with at least one of the magnetic structure and the voice coil of the electroacoustic transducer, the gain adjustment circuit comprising a current limited source circuit that has an output current and comprises a first current limited source and a second current limited source, the gain adjustment circuit being configured to:

(i) receive a displacement signal associated with a change in capacitance within the electroacoustic transducer as created by a relative motion between the magnetic structure of the electroacoustic transducer and the voice coil of the electroacoustic transducer;

(ii) receive a driving signal associated with the electroacoustic transducer, the driving signal configured to generate the relative motion between the magnetic structure of the electroacoustic transducer and the voice coil of the electroacoustic transducer;

(iii) detect a displacement signal value of the displacement signal as meeting or exceeding a displacement signal threshold;

(iv) detect an absolute value of a driving signal value of the driving signal as meeting or exceeding a driving signal threshold; and (v) modify, by the output current of the current limited source circuit, a loop gain of an active noise reduction loop associated with the electroacoustic transducer by: activating the current limited source circuit to provide the output current at a first value that is used to modify the loop gain when the absolute value of the driving signal value meets or exceeds the driving signal threshold; activating the first current limited source of the current limited source circuit to provide the output current at a second value that is used to modify the loop gain when the displacement signal is above a first displacement signal threshold; and activating the second current limited source of the current limited source circuit to provide the output current at a third value that is used to modify the loop gain when the displacement signal is below a second displacement signal threshold.

8. The acoustic assembly of claim 7, wherein the gain adjustment circuit comprises a threshold detector, the threshold detector, when detecting the displacement signal value of the displacement signal as meeting or exceeding the displacement signal threshold, being configured to detect the absolute value of the displacement signal.

9. The acoustic assembly of claim 7, wherein the gain adjustment circuit further comprises an integrator component and a compressor component, and wherein the current limited source circuit is configured to provide the output current to the integrator component of the gain adjustment circuit; and the integrator component is configured to provide a compressor control signal to the compressor component of the gain adjustment circuit based upon an output of the integrator component.

10. The acoustic assembly of claim 9, wherein when modifying the loop gain of the active noise reduction loop associated with the electroacoustic transducer the compressor component of the gain adjustment circuit is configured to modify the loop gain of the active noise reduction loop associated with the electroacoustic transducer based upon the received compressor control signal.

11. The acoustic assembly of claim 7, wherein, when detecting the displacement signal value of the displacement signal as meeting or exceeding the displacement signal threshold, a threshold detector is configured to detect, as the displacement signal value, an absolute value of the displacement signal; and when detecting the absolute value of the driving signal value of the driving signal as meeting or exceeding the driving signal threshold, the threshold detector is configured to detect the absolute value of the driving signal value of the driving signal as meeting or exceeding the driving signal threshold.

12. The acoustic assembly of claim 7, wherein when modifying the loop gain of the active noise reduction loop associated with the electroacoustic transducer, the gain adjustment circuit is configured to reduce the loop gain of the active noise reduction loop associated with the electroacoustic transducer when the displacement signal value of the displacement signal meets or exceeds the displacement signal threshold.

13. The acoustic assembly of claim 7, wherein the gain adjustment circuit is configured as a digital signal processor.

14. An acoustic assembly, comprising:

an active noise reduction assembly having an electroacoustic transducer with a magnetic structure and a voice coil, a microphone transducer disposed in proximity to the electroacoustic transducer, and an amplifier stage disposed in electrical communication with the microphone and the electroacoustic transducer, the active noise reduction assembly defining an active noise reduction loop having a loop gain;

a displacement sensing circuit disposed in electrical communication with at least one of the magnetic structure of the electroacoustic transducer and the voice coil of the electroacoustic transducer; and a gain adjustment circuit that is in electrical communication with the active noise reduction loop of the active noise reduction assembly and that is in electrical communication with the displacement sensing circuit, the gain adjustment circuit comprising a current limited source circuit that has an output current and comprises a first current limited source and a second current limited source, wherein the gain adjustment circuit is operable to:

(i) receive a displacement signal associated with a change in capacitance within the electroacoustic transducer as created by a relative motion between the magnetic structure of the electroacoustic transducer and the voice coil of the electroacoustic transducer;

(ii) receive a driving signal associated with the electroacoustic transducer, the driving signal configured to generate the relative motion between the magnetic structure of the electroacoustic transducer and the voice coil of the electroacoustic transducer;

(iii) detect a displacement signal value of the displacement signal as meeting or exceeding a displacement signal threshold;

(iv) detect an absolute value of a driving signal value of the driving signal as meeting or exceeding a driving signal threshold; and (v) modify, by the output current of the current limited source circuit, the loop gain of the active noise reduction loop associated with the electroacoustic transducer by: activating the current limited source circuit to provide the output current at a first value that is used to modify the loop gain when the absolute value of the driving signal value meets or exceeds the driving signal threshold; activating the first current limited source of the current limited source circuit to provide the output current at a second value that is used to modify the loop gain when the displacement signal is above a first displacement signal threshold; and activating the second current limited source of the current limited source circuit to provide the output current at a third value that is used to modify the loop gain when the displacement signal is below a second displacement signal threshold.

15. The acoustic assembly of claim 14, wherein the gain adjustment circuit comprises a threshold detector configured to detect the displacement signal value of the displacement signal generated by the displacement sensing circuit as meeting or exceeding the displacement signal threshold.

16. The acoustic assembly of claim 15, wherein the gain adjustment circuit further comprises an integrator disposed in electrical communication with the threshold detector, wherein the current limited source circuit is operable to generate the output current when activated by the threshold detector, and wherein the integrator is operable to convert the current limited source circuit output current to a compressor control signal having a value proportional to the current limited source circuit output current.

17. The acoustic assembly of claim 16, wherein the gain adjustment circuit further comprises a compressor component that is operable to modify the loop gain of the active noise reduction loop based upon the compressor control signal.

* * * * *